United States Patent [19]
Bullington

[11] Patent Number: 5,822,188
[45] Date of Patent: Oct. 13, 1998

[54] REMOVABLE CIRCUIT BOARD WITH DUCTED COOLING

[75] Inventor: James R. Bullington, Athens, Ala.

[73] Assignee: Intergraph Corporation, Huntsville, Ala.

[21] Appl. No.: 835,694

[22] Filed: Apr. 10, 1997

Related U.S. Application Data

[60] Provisional application No. 60/015,258 Apr. 10, 1996.

[51] Int. Cl.⁶ ...................................................... H05K 7/20
[52] U.S. Cl. ........................ 361/695; 165/86.3; 361/719; 454/184
[58] Field of Search ........................... 454/184; 174/15.1, 174/16.1; 165/121–126, 80.3; 361/690, 694, 695, 717–719, 720–722, 775

[56] References Cited

U.S. PATENT DOCUMENTS

| | | | |
|---|---|---|---|
| 4,417,295 | 11/1983 | Stuckert | 361/694 |
| 4,449,164 | 5/1984 | Carlson | 361/694 |
| 4,719,541 | 1/1988 | Ono | 361/695 |
| 4,797,783 | 1/1989 | Kohmoto et al. | 361/384 |
| 4,837,663 | 6/1989 | Zushi et al. | 361/384 |
| 5,214,570 | 5/1993 | Shah | 361/684 |
| 5,218,514 | 6/1993 | Huynh et al. | 361/384 |
| 5,504,651 | 4/1996 | Atarashi | 361/700 |
| 5,586,004 | 12/1996 | Green | 361/699 |
| 5,630,469 | 5/1997 | Butterbaugh | 361/699 |
| 5,706,170 | 1/1998 | Glovatsky | 361/695 |
| 5,717,572 | 2/1998 | Smith | 361/695 |

FOREIGN PATENT DOCUMENTS

| | | | |
|---|---|---|---|
| 0 067 059 | 6/1982 | European Pat. Off. | H05K 7/20 |
| 0 614 330 A1 | 8/1993 | European Pat. Off. | H05K 7/20 |

OTHER PUBLICATIONS

Soviet Patent Abstracts, E1 Section, Week 8731, Issued 1986, 11/30, Derwent Publications Ltd. Nov. 1986.

*Primary Examiner*—Gerald P. Tolin
*Attorney, Agent, or Firm*—Bromberg & Sunstein LLP

[57] ABSTRACT

A system for cooling a circuit board within a chassis having an interior and an interior wall includes a member that extends between the interior wall and a face of the circuit board. To that end, the system further includes an inlet formed in the chassis for receiving air to cool the circuit board, an outlet formed in the chassis for ejecting air from the interior of the chassis, and the member. The member may physically contact the face of the circuit board.

18 Claims, 6 Drawing Sheets

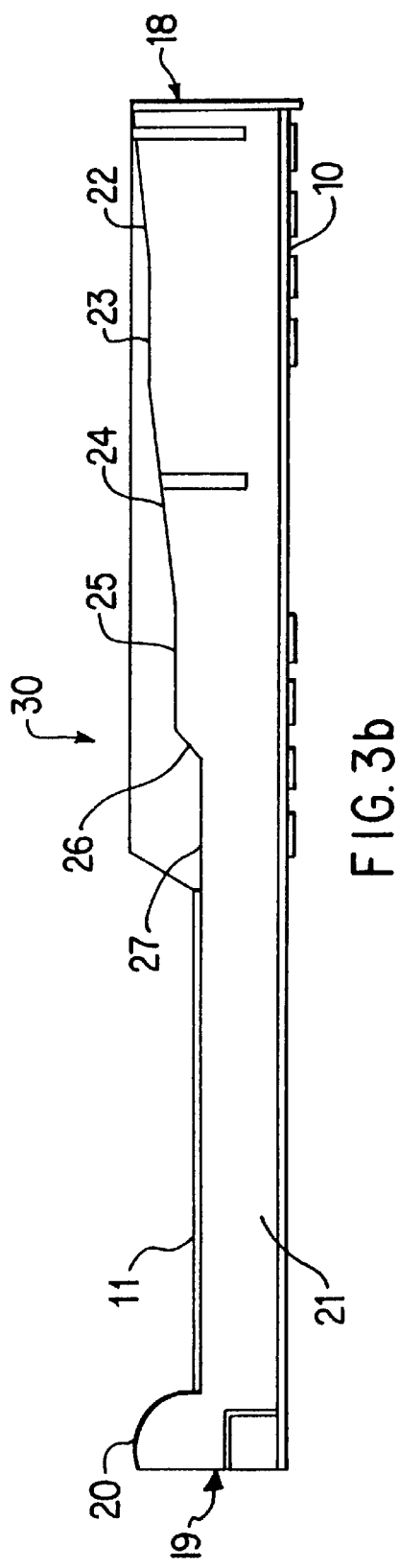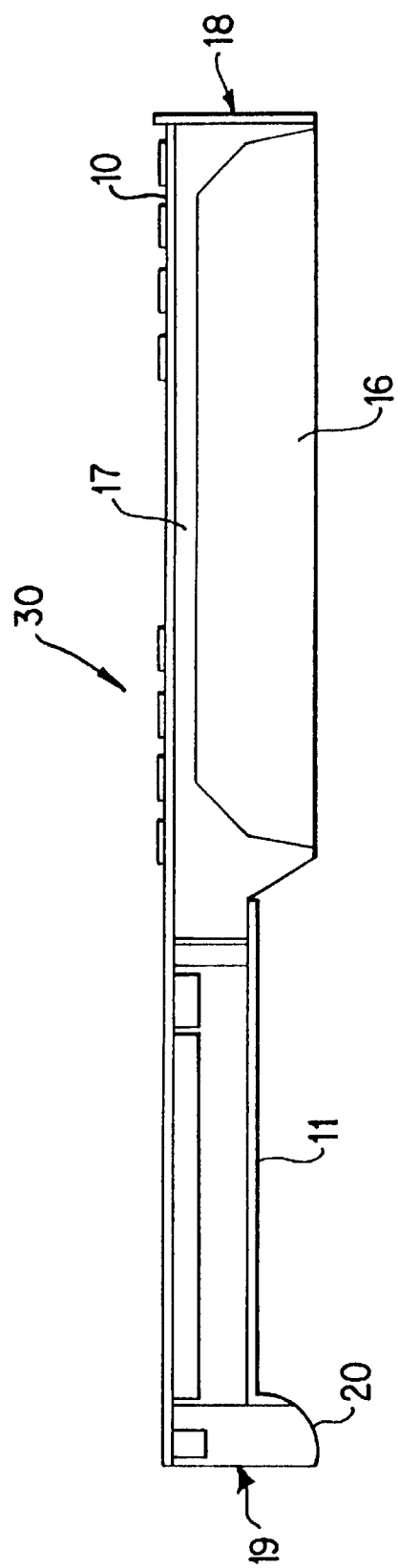

1

REMOVABLE CIRCUIT BOARD WITH DUCTED COOLING

This application claims priority from provisional application serial number 60/015,258 filed Apr. 10, 1996, entitled Removable Circuit Board with Ducted Cooling which is incorporated herein by reference.

FIELD OF THE INVENTION

The present invention generally relates to circuit boards having a cooling arrangement, and more particularly to actively cooled removable circuit boards for use in a computer.

BACKGROUND OF THE INVENTION

Removable circuit boards have numerous components, including integrated circuits and other components that may consume substantial amounts of power. A component that consumes substantial amounts of power often generates an excessive amount of heat. Moreover, a specific component is designed to reliably operate within a certain temperature range. Therefore, if the temperature of a component exceeds that range, the component may not operate reliably, if at all. Such components are also known as hot components.

Previously, there have been two cooling systems used for removable circuit boards. The first cooling system provides the means for cooling only one component of the board at a time. This type of system provides site cooling. In site cooling, an individual fan is mounted on the heat sink to cool one component on the board. Using this type of cooling system for each hot component of a removable circuit board would be unduly bulky and inefficient.

The second type of cooling system provides a fan within a chassis, not on the board, to supply enough airflow through the chassis to cool all the components in the chassis including any circuit boards. However, this type of system for cooling the components of a removable circuit board does not work for all board configurations. For example, hot components that have ball grid arrays instead of pins for mounting on a board present a special case. The reliability of that type of hot component is affected by stresses generated during the expansion and contraction of the components and the board due to temperature changes. Moreover, in order to get enough airflow in such a configuration, the size and type of chassis in which the removable circuit board is mounted must be considered. Thus, using this type of cooling system for some removable board configurations would be inadequate.

Another type of cooling system has been used for the (non-removable) mother board (CPU board) of a computer. This system uses a ducted design to provide cooled air to the critical components of the mother board. However, it is difficult to use such a system for cooling a removable circuit board.

Therefore, what is needed is a simple and compact system of cooling that efficiently provides cooled air to the components of a removable circuit board, independent of the size and type of chassis in which the circuit board is mounted.

SUMMARY OF THE INVENTION

The present invention, in a preferred embodiment, is directed to an actively cooled removable circuit board that includes a circuit board having a connector along one end for connection to a mother board. The circuit board has one or more hot locations, i.e., locations for components that generate excessive heat. The present invention includes a duct for defining an air-cooling path wherein the path includes one or more hot locations. The air-cooling path is defined by the duct having an open side that is proximate to the circuit board so that the circuit board defines one boundary of the air-cooling path.

An inlet is provided for injecting cooled air onto the circuit board and an outlet is provided for ejecting the air. The circuit board and the duct constitute an assembly. Moreover, a fan is mounted on the assembly and the fan is located so as to cause airflow along the path from the inlet to the outlet.

The duct may be constricted in the vicinity of the hot locations such that the cross sectional area of the duct is variable along the air-cooling path. This allows the velocity of the airflow to increase near the hot locations which improves the heat transfer between components and the air.

The duct may be advantageously divided into multiple sections. The sections may be configured such that the airflow in one section does not mix or communicate with the airflow in the other sections. A section of the duct may have its own fan mounted to the assembly and located so as to cause airflow along the path defined by that section of duct. Moreover, a section of the duct may have its own inlet bringing air inside the chassis and its own outlet exhausting air outside the chassis.

BRIEF DESCRIPTION OF THE DRAWINGS

FIG. 1b is a top view of the configuration of the circuit board 10 of the embodiment of FIG. 1a.

FIG. 2a is a top sectional view of the embodiment of FIG. 1a illustrating the airflow path of a first embodiment of the duct of FIG. 1a.

FIG. 2b is a top sectional view of the embodiment of FIG. 1a illustrating the airflow path of a second embodiment of the duct of FIG. 1a.

FIG. 3b is a side view of the duct of FIG. 3a.

FIG. 3c is the other side view of the duct of FIG. 3a (reversed top and bottom).

DETAILED DESCRIPTION OF THE DRAWINGS

Figure 1A:
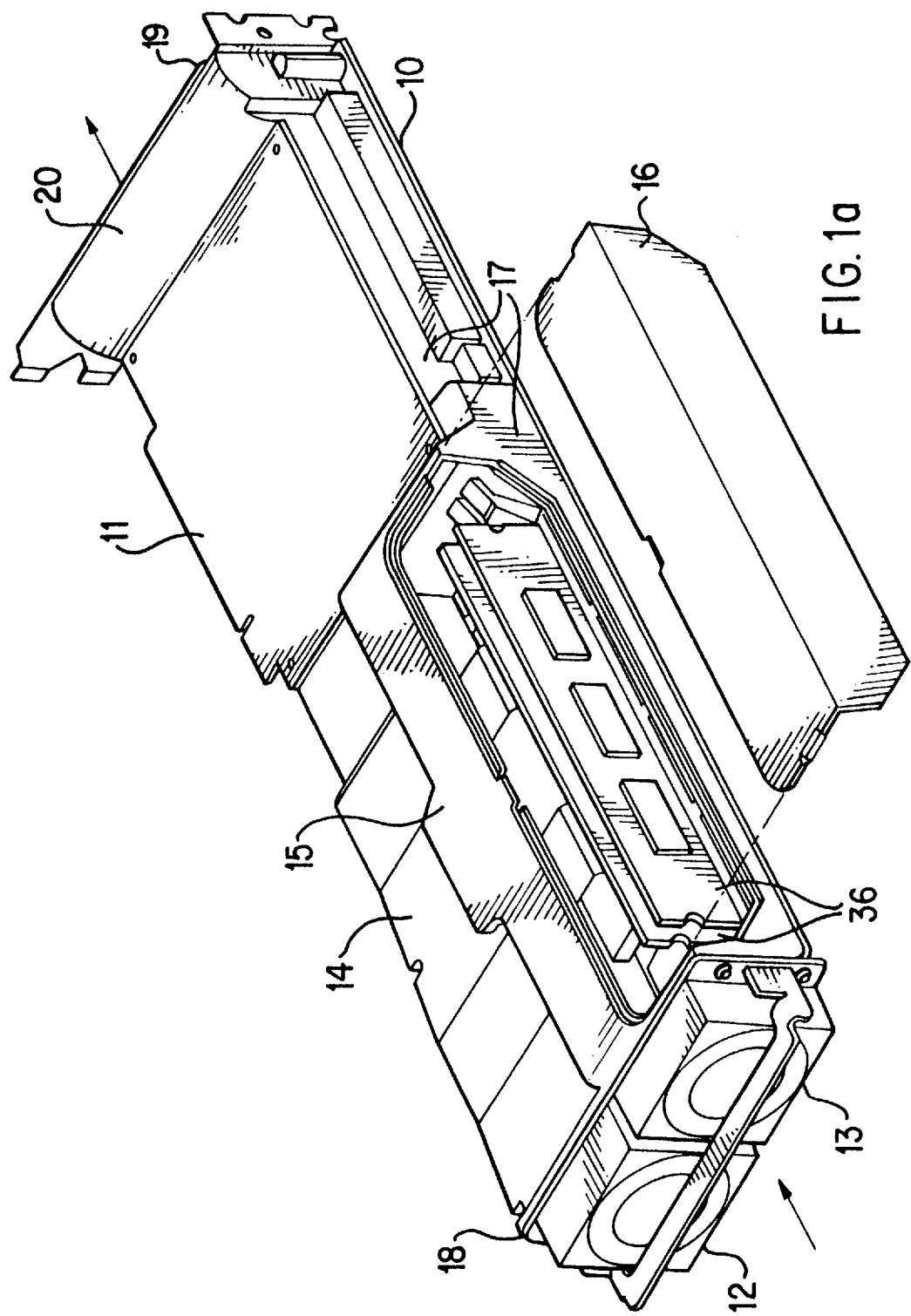
FIG. 1a is an isometric view of an actively cooled removable circuit board of a preferred embodiment of the present invention.

Referring now to the drawings, FIG. 1a shows an actively cooled removable circuit board of a preferred embodiment of the present invention. A circuit board 10 is shown, forming the bottom surface of the embodiment of FIG. 1a. A second VGA circuit board 11 forms a portion of the top surface of the embodiment of FIG. 1a.

Figure 1B:
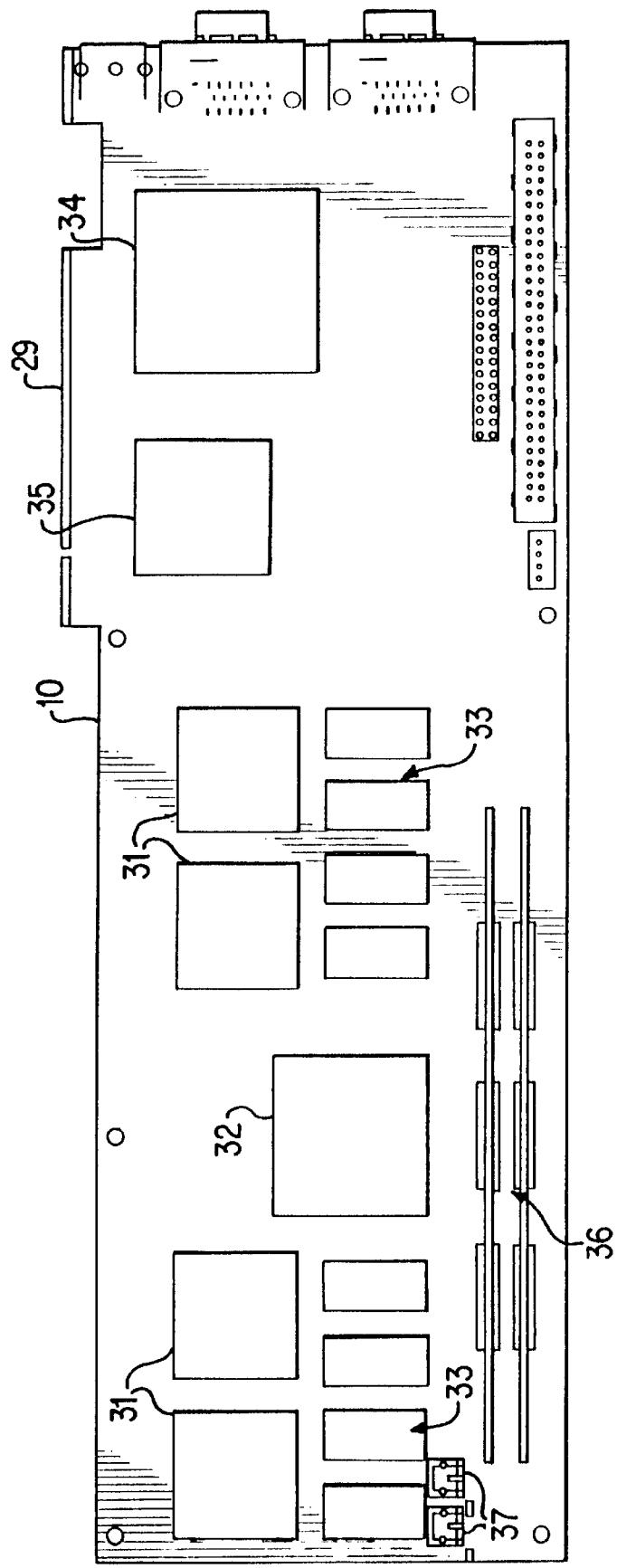

FIG. 1b shows a top view of the circuit board 10 which has numerous components mounted thereon. Resolvers 31 and Graphics Engine 32 are the hot components. Each of these hot components are associated with a hot location on the circuit board 10. Video Memory 33, RAMDAC 34, PCIDMA 35, and Texture Memory 36 are relatively cool components, i.e., consume relatively less power in comparison to Resolvers 31 and the Graphics Engine 32. Circuit board 10 is supplied power via an edge connector 29 which connects to a mother board (not shown). Moreover, circuit board 10 is configured with pin connectors 37 for supplying power to fans 12 and 13 (shown in FIG. 1a).

The elements constituting a duct 30 of the present invention are shown in FIGS. 1a, 3a, 3b, and 3c. A top surface of circuit board 10, a bottom surface of VGA circuit board 11, a first top housing 14, a second top housing 15, a removable cover 16, a first side housing 17, an outlet housing 20, and a second side housing 21 define a duct 30. The duct 30 may include an inlet 18 and an outlet 19. Moreover, duct 30 defines an air-cooling path wherein the path includes the hot locations. The air-cooling path is transverse to a normal to an end of the edge connector 29.

The duct 30 and the circuit board 10 form an assembly to which fans 12 and fan 13 are mounted. In a preferred embodiment, the fans 12 and 13 are mounted to the assembly using a bracket and screws. Fans 12 and 13 are mounted at the inlet 18 so as to cause airflow along the path defined by duct 30. The airflow moves along the path defined by the duct 30 and is ejected or removed at the outlet 19.

Figure 2A:
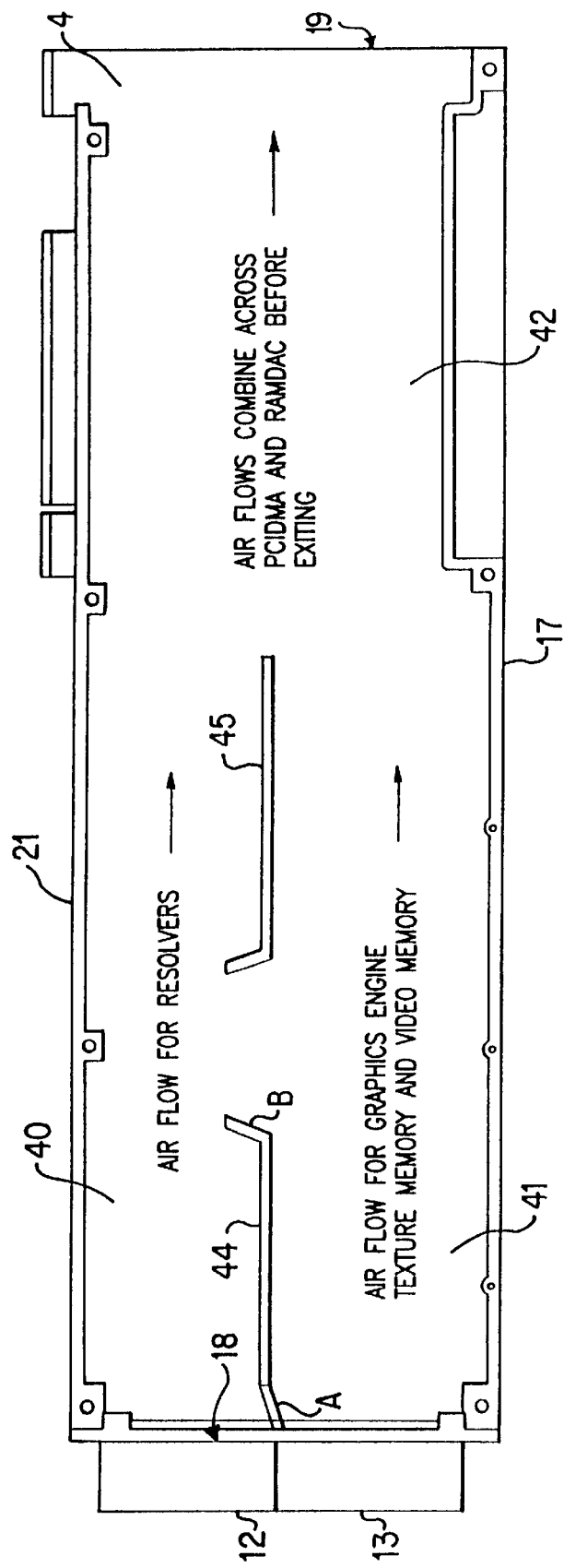
Figure 2B:
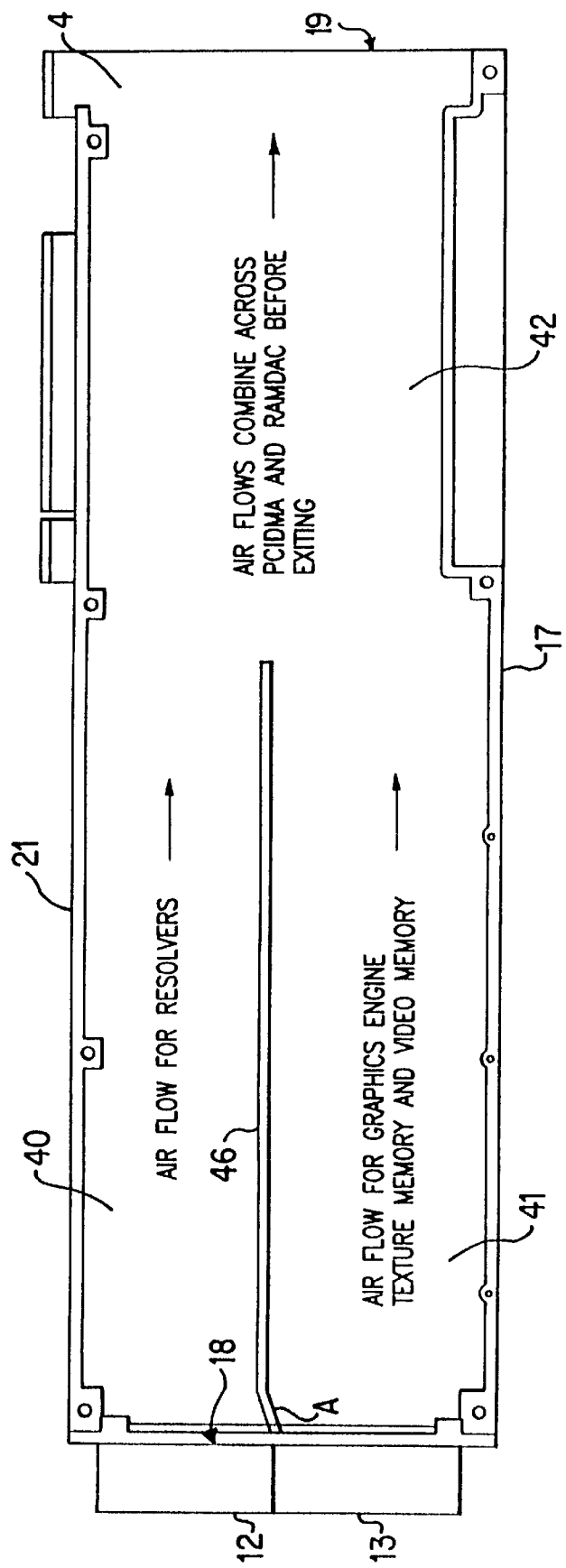

In a preferred embodiment, duct 30 is divided into multiple sections (shown in FIGS. 2a & 2b). In FIG. 2a, first section 40 of duct 30 overlies the Resolvers 31 (shown in FIG. 1b). The second section 41 of duct 30 overlies the Graphics Engine 32, the Video Memory 33, and the Texture Memory 36 (all shown in FIG. 1b). The third section 42 of duct 30 overlies the RAMDAC 34 and the PCIDMA 35 (both shown in FIG. 1b).

Referring now to FIGS. 1a and 2a, a first section 40 of duct 30 is defined by the first top housing 14, the second side housing 21, a first wall portion 44, a second wall portion 45, and a first area of the top surface of circuit board 10. The first section 40 of duct 30 receives a first airflow from fan 12.

The second section 41 of duct 30 is defined by the second top housing 15, the first side housing 17, the removable cover 16, the first wall portion 44, the second wall portion 45, and a second area of the top surface of circuit board 10. The second section 41 of duct 30 receives a second airflow from fan 13. When first wall portion 44 and second wall portion 45 are segmented (shown in FIG. 2a), then the air-cooling path of the first section 40 of duct 30 and the air-cooling path of the second section 41 of duct 30 are such that there is communication between the airflow in the first section 40 and the airflow in the second section 41 of duct 30. The communication is due to crossflow through an opening between first wall portion 44 and second wall portion 45.

Alternatively, when the first wall portion 44 and the second wall portion 45 are replaced by a continuous, solid wall 46 (shown in FIG. 2b), then there is no communication between the airflow in the first section 40 of duct 30 with the airflow in the second section 41 of the duct 30.

The third section 42 of duct 30 is defined by the bottom surface of the VGA board 11, the first side housing 17 and the second side housing 21. The third section 42 receives an airflow from the airflow of the first section 40 of duct 30 combined with the airflow of the second section 41 of duct 30. The airflow in the third section 42 of duct 30 passes through the outlet section 43 of duct 30 before it is ejected at the outlet 19. In a preferred embodiment of FIG. 1a, the outlet section 43 of duct 30 is curved upward (as shown at 20 in FIG. 3b) so as to communicate with the outlet 19 for ejecting the airflow from the outlet section 43 of duct 30.

As air flows through the duct 30, the temperature of the air tends to increase due to the flow of air over hot locations. The duct 30 is preferably designed so that the components that are in the downstream airflow do not see excessive heat build-up from upstream components. Therefore, the cross sectional area of the duct 30 varies from the inlet 18 to the outlet 19.

Figure 3A:
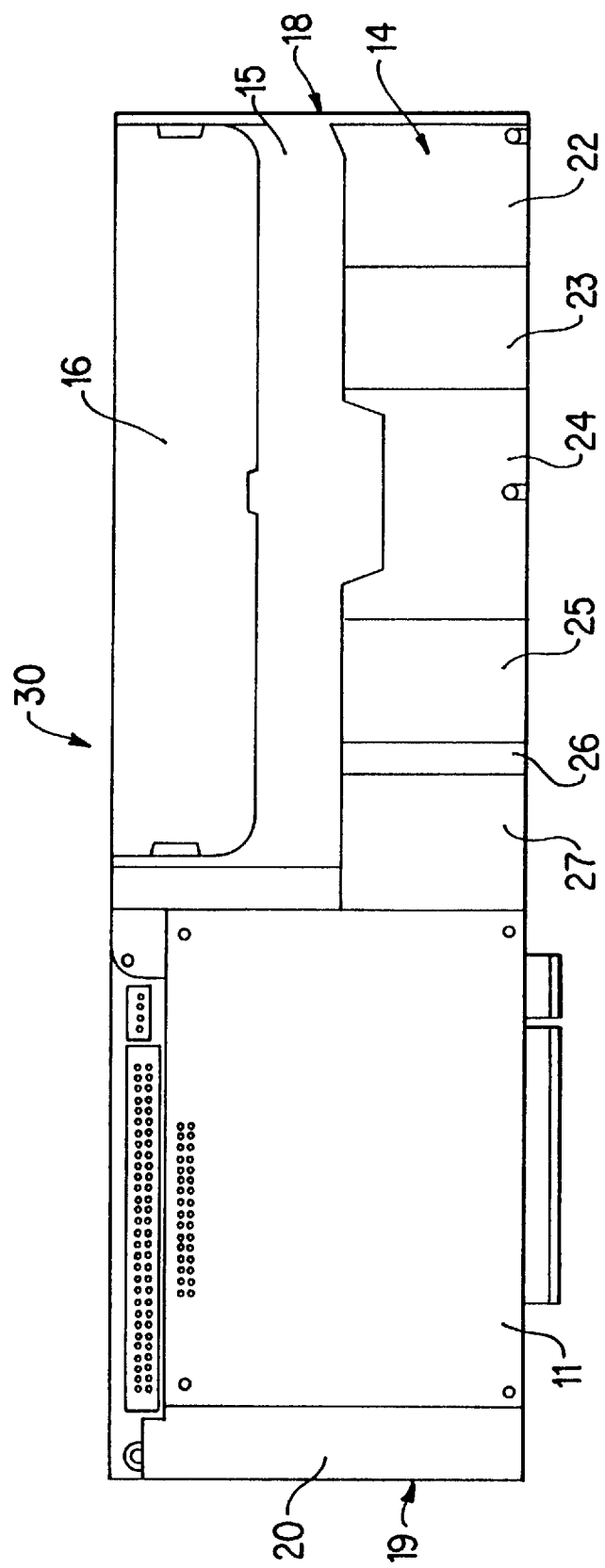
FIG. 3a is a top view of a duct of the embodiment of FIG. 1a (reversed right and left).

The step-down reductions in the cross-sectional area of duct 30, shown in detail in FIGS. 3a and 3b, (as well as restrictions in FIGS. 2a and 2b at A and B) tend to increase downstream airflow velocity. There are six step-down areas, 22, 23, 24, 25, 26, and 27 along first top housing 14. These step-down areas, increase the cooling effect near the vicinity of the hot locations because reducing the cross sectional area of the duct tends to increase the velocity of the airflow as it moves from the inlet 18 to outlet 19. Therefore, this step-down reduction in the cross sectional area of the duct 30 improves the heat transfer between the hot components and the air. Furthermore, it is preferred that the components which may be subject to a more rapid heat build-up are advantageously placed on the circuit board 10 such that they are near the inlet 18 and receive the initial and therefore coolest airflow. Moreover, additional step-down reductions occur due to the restrictions at A and B (shown in FIGS. 2a and 2b).

In a preferred embodiment, a portion of the duct 30 is injection molded plastic. Of course, it should be understood that various changes and modifications to the preferred embodiment described above will be apparent to those skilled in the art. For example, there may be only one fan with one section of duct. Furthermore, the duct could be mounted on the board or the fans could be mounted on the duct using a snap-lock mechanism instead of screws.

Therefore, these and other changes can be made without departing from the spirit and the scope of the invention and without diminishing its attendant advantages. It is therefore intended that such changes and modifications be covered by the following claims.

What is claimed is:

1. A system including a circuit board within a housing, the housing having an interior defined at least in part by an interior wall, the circuit board having a face, the system comprising:

an inlet formed in the housing for receiving air to cool the circuit board;

an outlet formed in the housing for ejecting air from the interior of the housing; and a member extending between the interior wall and the face of the circuit board, the member physically contacting both the face of the circuit board and the interior wall, the member and interior wall at least in part forming a forced air-cooling path along the face of the circuit board, wherein the member is free from electronic conductors.

2. The system as defined by claim 1 wherein the member is connected to the interior wall.

3. The system as defined by claim 1 further comprising:

a fan coupled to the inlet to direct air into the interior of the housing.

4. The system as defined by claim 1 wherein the air-cooling path has a cross-sectional area and wherein the interior wall includes at least one stepped portion to reduce the cross-sectional area of the air-cooling path from the at least one stepped portion to the outlet.

5. The system as defined by claim 4 wherein between the inlet and the outlet, the interior wall is stepped at angles of between about zero and about ninety degrees with respect to the plane of the face of the circuit board.

6. The system as defined by claim 5 wherein the interior wall defines first and second portions, the first portion being stepped at a first angle between about zero and about ninety degrees, the second portion being stepped at a second angle between about zero and about ninety degrees, the first angle and second angle being different.

7. The system as defined by claim 1 wherein the circuit board includes a first thermally critical element and a second thermally critical element, the first thermally critical element requiring cooling more than the second thermally critical element, the first thermally critical element being located in the air-cooling path between the inlet and the second thermally critical element.

8. The system as defined by claim 1 wherein the member is segmented.

9. The system as defined by claim 1 wherein the member is connected to the circuit board.

10. A duct comprising:

a circuit board having a face;

a housing coupled to the circuit board, the housing having an interior surface;

an inlet formed in the housing for receiving air;

an outlet formed in the housing for ejecting air; and a member extending between the interior surface of the housing and the face of the circuit board, the member physically contacting both the face of the circuit board and the interior surface of the housing, the member, face of the circuit board, and interior surface of the housing forming a forced air-cooling path, wherein the member is free from electronic conductors.

11. The duct as defined by claim 10 wherein the member is connected to the interior surface.

12. The duct as defined by claim 10 further comprising:

a fan coupled to the inlet to direct air into the interior of the housing.

13. The duct as defined by claim 10 wherein the air-cooling path has a cross-sectional area and wherein the interior surface includes at least one stepped portion to reduce the cross-sectional area of the air-cooling path from the at least one stepped portion to the outlet.

14. The duct as defined by claim 13 wherein between the inlet and the outlet, the interior surface is stepped at angles of between about zero and about ninety degrees with respect to the plane of the face of the circuit board.

15. The duct as defined by claim 14 wherein the interior surface defines first and second portions, the first portion being stepped at a first angle between about zero and about ninety degrees, the second portion being stepped at a second angle between about zero and about ninety degrees, the first angle and second angle being different.

16. The duct as defined by claim 10 wherein the circuit board includes a first thermally critical element and a second thermally critical element, the first thermally critical element requiring cooling more than the second thermally critical element, the first thermally critical element being located in the air-cooling path between the inlet and the second thermally critical element.

17. The duct as defined by claim 10 wherein the member is segmented.

18. The duct as defined by claim 10 wherein the member is connected to the circuit board.

* * * * *